(12) United States Patent
Chen et al.

(10) Patent No.: US 9,960,274 B2
(45) Date of Patent: May 1, 2018

(54) FINFET DEVICE FOR DEVICE CHARACTERIZATION

(71) Applicant: Taiwan Semiconductor Manufacturing Co., Ltd., Hsin-Chu (TW)

(72) Inventors: Hao-Yu Chen, Kaohsiung (TW); Chang-Yun Chang, Taipei (TW); Cheng-Chuan Huang, Taipei County (TW); Fu-Liang Yang, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days. days.

(21) Appl. No.: 15/277,738

(22) Filed: Sep. 27, 2016

(65) Prior Publication Data

US 2017/0018641 A1    Jan. 19, 2017

Related U.S. Application Data

(62) Division of application No. 11/701,348, filed on Feb. 1, 2007, now Pat. No. 9,455,348.

(51) Int. Cl.
  *H01L 29/78* (2006.01)
  *H01L 29/66* (2006.01)
  *H01L 29/417* (2006.01)

(52) U.S. Cl.
  CPC ...... *H01L 29/785* (2013.01); *H01L 29/41725* (2013.01); *H01L 29/66492* (2013.01); *H01L 29/66795* (2013.01); *H01L 29/7833* (2013.01)

(58) Field of Classification Search
  CPC ............. H01L 29/785; H01L 29/66795; H01L 27/0886; H01L 27/0924; H01L 21/823821; H01L 21/823431; H01L 21/845
  See application file for complete search history.

(56) References Cited

U.S. PATENT DOCUMENTS

| | | |
|---|---|---|
| 6,015,993 A | 1/2000 | Voldman et al. |
| 6,372,559 B1 | 4/2002 | Crowder et al. |
| 6,406,962 B1 | 6/2002 | Agnello et al. |
| 6,413,802 B1 | 7/2002 | Hu et al. |
| 6,706,571 B1 | 3/2004 | Yu et al. |
| 6,858,478 B2 | 2/2005 | Chau et al. |
| 7,056,781 B2 | 6/2006 | Yoon et al. |
| 7,190,050 B2 | 3/2007 | King et al. |
| 7,247,887 B2 | 7/2007 | King et al. |
| 7,265,008 B2 | 9/2007 | King et al. |

(Continued)

*Primary Examiner* — Tucker J Wright
(74) *Attorney, Agent, or Firm* — Haynes and Boone, LLP

(57) ABSTRACT

FinFET devices, along with methods for fabricating such devices, are disclosed herein for facilitating device characterization. An exemplary FinFET device includes a fin having a first portion extending in a first direction and a second portion extending from the first portion in a second direction. The second direction is substantially perpendicular to the first direction. The first portion includes a first region doped with a first type dopant disposed between second regions doped with a second type dopant. The first type dopant is opposite the second type dopant. A source contact and a drain contact are coupled to the second regions of the first portion, and a body contact is coupled to the second portion. A gate is disposed over the first region of the first portion, and the second portion extends from the first region.

20 Claims, 10 Drawing Sheets

(56) References Cited

U.S. PATENT DOCUMENTS

| | | |
|---|---|---|
| 7,358,121 B2 | 4/2008 | Chau et al. |
| 7,508,031 B2 | 3/2009 | Liu et al. |
| 7,528,465 B2 | 5/2009 | King et al. |
| 7,605,449 B2 | 10/2009 | Liu et al. |
| 7,807,523 B2 | 10/2010 | Liu et al. |
| 7,939,862 B2 | 5/2011 | Moroz et al. |
| 7,960,232 B2 | 6/2011 | King et al. |
| 8,175,728 B2 | 5/2012 | Weinberg et al. |
| 8,466,490 B2 | 6/2013 | Liu et al. |
| 2004/0084211 A1 | 5/2004 | Fayfield |
| 2004/0084674 A1 | 5/2004 | Mathew et al. |
| 2004/0099903 A1 | 5/2004 | Yeo et al. |
| 2006/0084211 A1* | 4/2006 | Yang ................ H01L 29/66795 438/197 |
| 2006/0273372 A1 | 12/2006 | Voldman et al. |

\* cited by examiner

FINFET DEVICE FOR DEVICE CHARACTERIZATION

PRIORITY DATA

This is a divisional application of U.S. patent application Ser. No. 11/701,348, filed Feb. 1, 2007, now U.S. Pat. No. 9,455,348, the entire disclosure of which is incorporated herein by reference.

BACKGROUND

Before the advances of FinFET technologies, semiconductor devices were arranged whereby their active areas were laid out on a horizontal plane, side by side each other. As technology continues to advance and the necessity to pack more semiconductor devices on a single chip become more pressing, the need to devise a new arrangement is of paramount importance.

FinFET technologies provide a viable alternative to pack hundreds of millions of semiconductor devices within a single chip while still reducing the area of the chip. In FinFET technologies, because the active areas of these semiconductor devices are placed vertically, the total required planar area is reduced.

FinFET also offers various design characteristics that can reduce leakage. As one example, active areas are built on an insulator, which minimizes leakage, instead of a semiconductor substrate typical in older technologies. As another example, because FinFET technologies allow the channel to wrap around the body between the source and the drain, a double gate having gates on each vertical side of the depletion region is possible whereby the double gated device provides a lower channel leakage current than a single gated device. As a further example, leakage in a fin of the FinFET is reduced simply because of the reduction of the volume of the body.

However, current FinFET technologies do not provide an easy mechanism to characterize devices in designs and in production, because there is no easy way to make contact to all four terminals (the source, the drain, the gate, and the body) of a semiconductor device. When the source, the drain, and the gate are available, the body is unavailable because there is no way of reaching the body when the device is on top of an insulator. Without electrical information from all four terminals, adequate information regarding the device cannot be fully retrieved, thus limiting the viability and effectiveness when deploying FinFET technologies.

Desirable in the art of semiconductor designs are additional designs for better enabling device characterization in a FinFET device environment.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to semiconductor devices, and more particularly, to a system of structures for better enabling device characterization for FinFET devices. In some implementations, the present disclosure provides a detailed description for construction of a body contact for device characterization in FinFET device environments.

Figure 1:
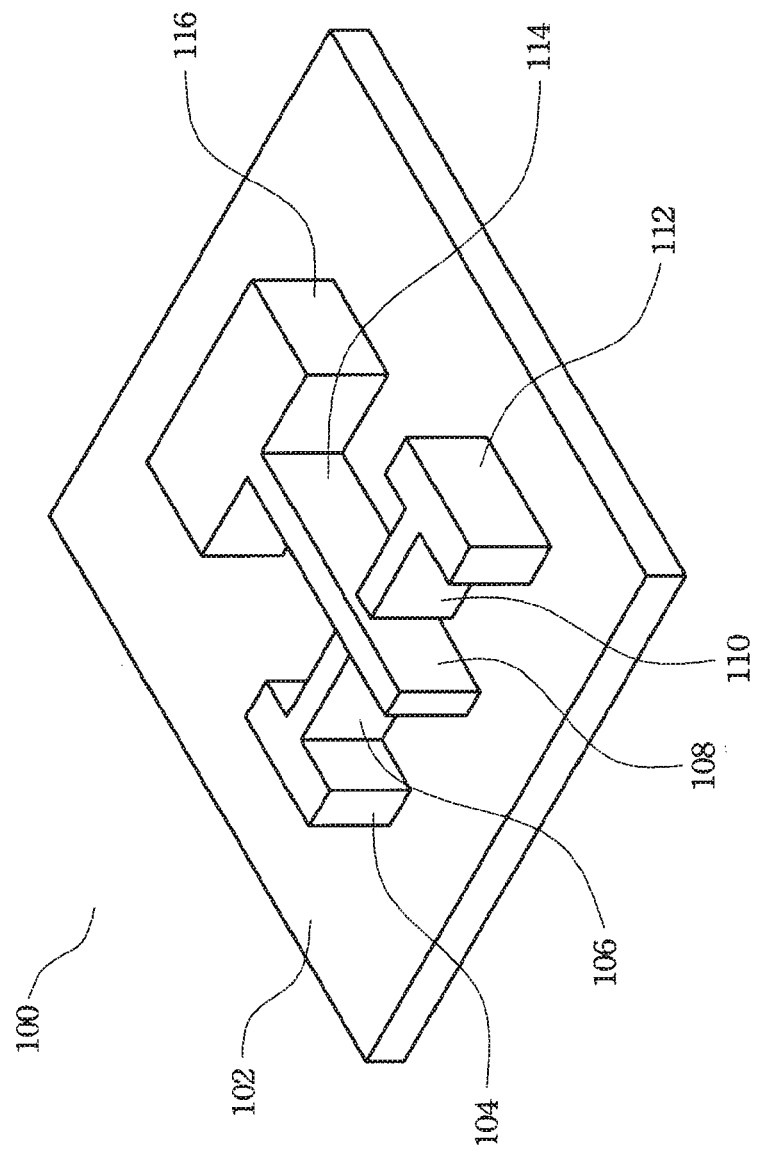
FIG. 1 presents an isometric view of a conventional FinFET metal-oxide-semiconductor field-effect-transistor according to various aspects of the present disclosure.

In FIG. 1, an isometric view 100 illustrates a conventional FinFET metal-oxide-semiconductor field-effect-transistor (MOSFET). This type of transistor saves space by turning the active areas and gate electrodes into vertical planes instead of the traditional horizontal planes. The transistor is built on a horizontal plane of buried oxide BOX 102. The active area of the transistor includes a source contact area 104, a vertical source fin 106, a body fin 108 (also a vertical well), a vertical drain fin 110, and a drain contact area 112. The body fin 108 is surrounded on both sides as well as the top by a vertical gate electrode fin 114, which is further connected to a gate contact area 116. In FIG. 1, the hard mask that is used to protect the active area during etching is removed prior to the formation of the gate dielectric layer. Therefore, the vertical gate electrode fin 114 functions as a gate electrode on all three sides of the body fin 108 that it surrounds. If the hard mask had not been removed, the top surface of the body fin 108 would not have been susceptible to the influence of the vertical gate electrode fin 114 and only the two vertical side surfaces of the body fin 108 would have acted as MOS channels. However, in FIG. 1, all three surfaces—the top and the two sides of the body fin 108—function as MOS channels that are controlled by the vertical gate electrode fin 114.

The mask may be composed of a photoresist layer or a hard mask material such as silicon oxide $SiO_2$, silicon nitride $Si_3N_4$, or a combination thereof. In this preferred embodiment, the material is $SiO_2$.

A feature of one embodiment of the present disclosure is a fin smoothing step that is introduced before the formation of the gate dielectric. A first option for smoothing the surfaces of the active fin, which includes the vertical source fin 106, the body fin 108, and the vertical drain fin 110, is the formation and then removed, by etching, of a sacrificial oxide. A second option for smoothing the surfaces of the active fin is by, for instance, a high temperature anneal at 1,000° C. in a hydrogen ambient. If the photoresist is used as the masking material, it must be removed before any high temperature treatment. Smoothing the surfaces of the fin that will become gate areas on the body fin 108 contributes to improved carrier mobility, and therefore improved FinFET performance.

If a hard mask is removed before a surface smoothing step, then the top surface of the smoothed fin is rounded by the smoothing step. If a hard mask is not removed before a surface smoothing step, then the top surface of the smoothed fin will retain a square-cornered shape.

Figure 2:
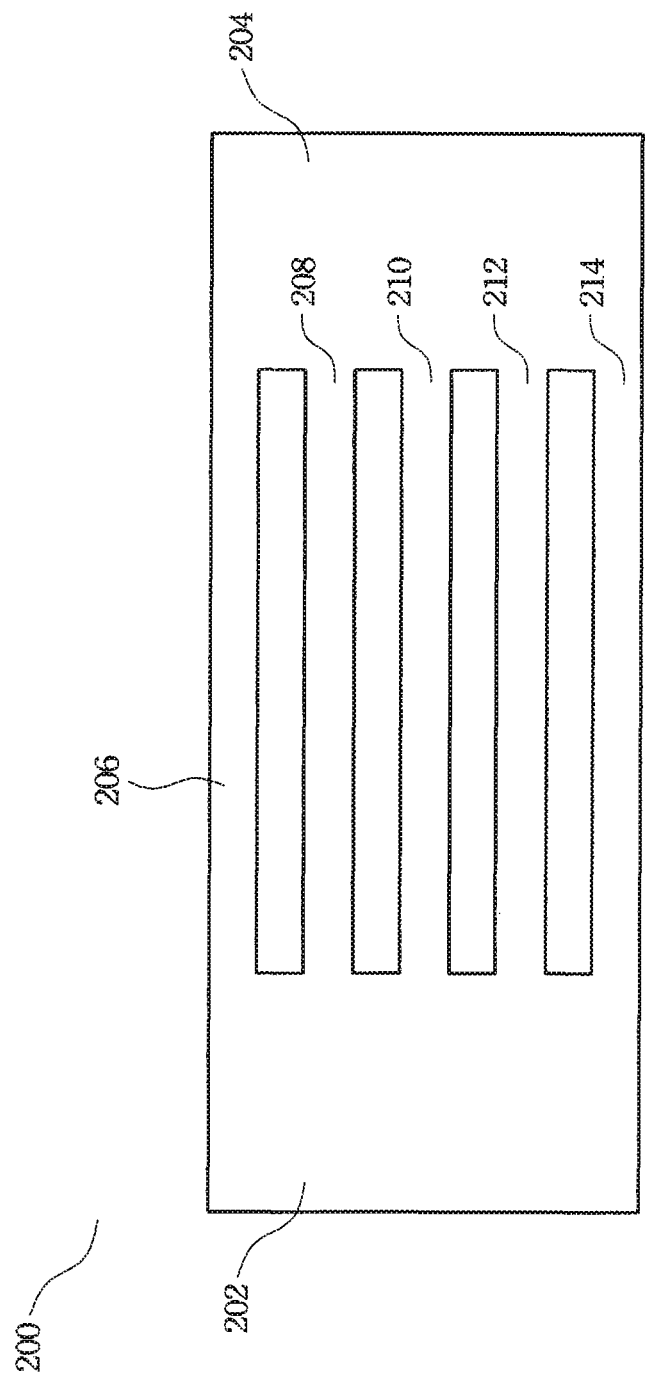
FIG. 2 presents a chip layout of the active area of a FinFET according to various aspects of the present disclosure.

A first embodiment is the construction of devices that are useful only for the evaluation of device parameters. In FIG. 2, a chip layout 200 illustrates the active area of a FinFET that has the same basic layout as that in FIG. 1, but with five active fins instead of just one. On a horizontal plane of BOX, not shown, a source contact area 202 is connected to a drain contact area 204 by five vertical active fins 206, 208, 210, 212, and 214. After etching has defined this area, the surface smoothing step described above may be performed. Then, a well implant is performed to set junction breakdowns and threshold voltages.

Figure 3:
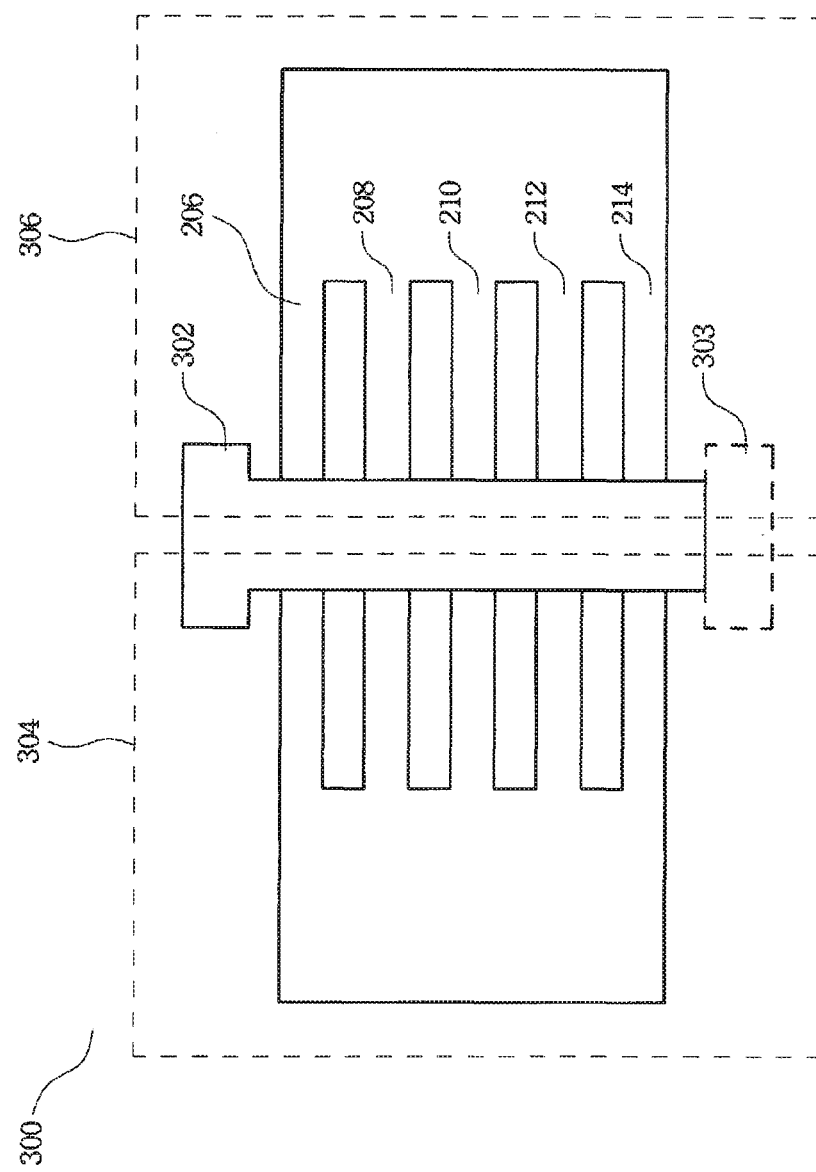
FIG. 3 presents a chip layout of a P-well device according to various aspects of the present disclosure.

In FIG. 3, a chip layout 300 illustrates a P-well device. Because it does not have a second N+ region, it is not a normal N-channel MOS transistor but merely a test device. Then, a gate dielectric is formed. The gate dielectric may be formed by thermal oxidation, chemical vapor deposition (CVD), sputtering, or other methods. Depending on the technique used, the thickness on the top surface of the active fins may be different from that on the sidewalls. In some applications, the dielectric thickness may be less than 20 □. The gate dielectric may be composed of a conventional material such as SiO2 or silicon oxynitride with a thickness ranging from 3 to 100 □, preferably, 10 □ or less. The gate dielectric may also be composed of high permittivity (high κ) materials such as aluminum oxide Al2O3, hafnium oxide HfO2, or zirconium oxide ZrO2 with an equivalent oxide thickness of 3 to 100 □.

Next, the gate electrode material is deposited. The gate electrode material perfectly fills the slots between the active fins 206, 208, 210 212, and 214. The gate electrode material may be polycrystalline silicon, polycrystalline silicon-germanium Poly SiGe, a refractory metal such as molybdenum or tungsten, compounds such as titanium nitride, or other electrically conducting materials. In FIG. 3, a gate dielectric mask pattern 302 is defined and, in exposed areas, the underlying gate dielectric material is etched away, leaving the gate electrode. The gate electrode etch stops on the gate dielectric. Then, the gate electrode is isolated from the transistor structure by the gate dielectric. The gate masking material is then removed. It is contemplated that an optional second gate dielectric mask pattern 303 may be defined.

The P-type lightly-doped drain (LDD) is implanted through a mask window 304 to make good electrical contact to the P-well. The N-type LDD is implanted through the mask window 306 to form the normal drain diode. Now, since electrical contact to the MOS body, as the P-well, is available for electrical testing techniques such as C-V testing, the structures and parameters typical of MOS devices in neighboring integrated circuits can be evaluated.

Figure 4:
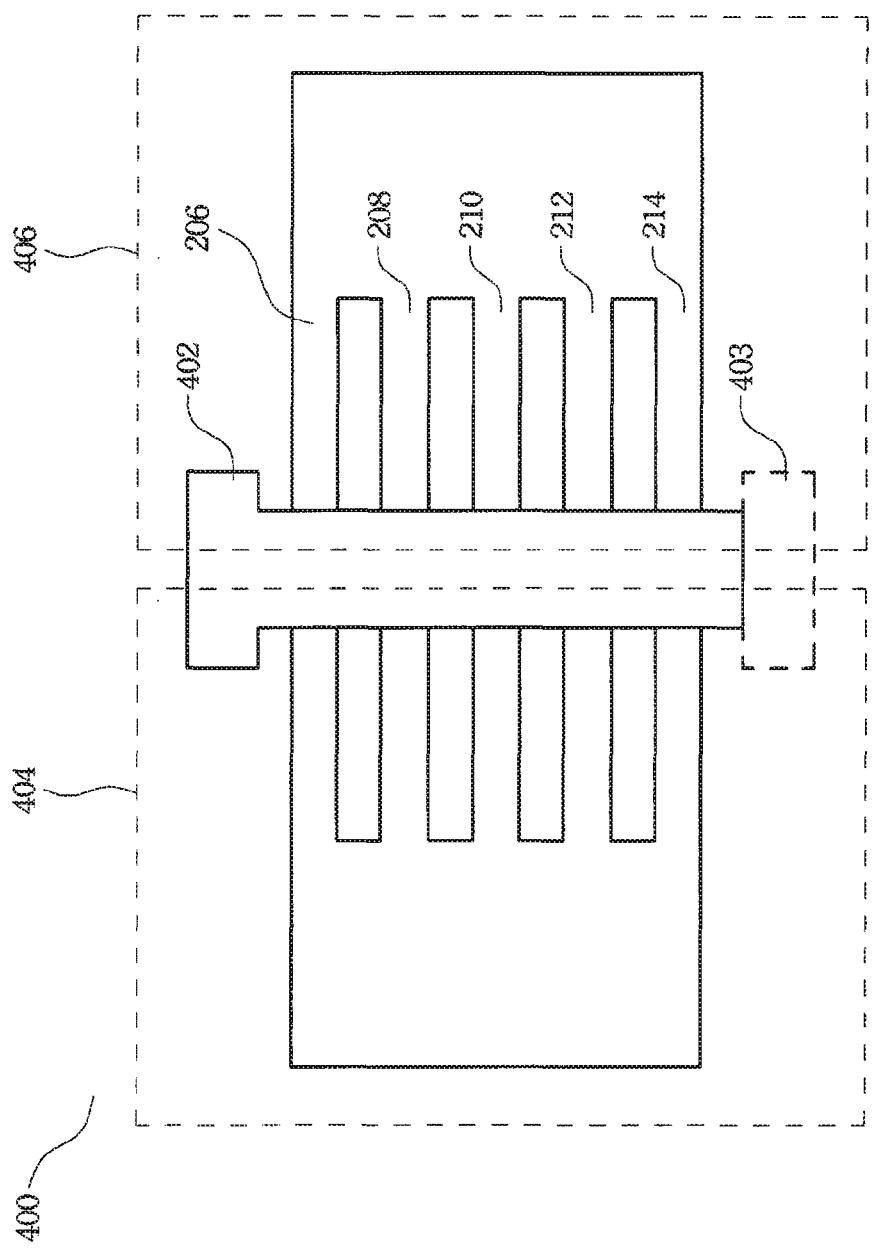
FIG. 4 presents a chip layout of a N-well device according to various aspects of the present disclosure.

In FIG. 4, a chip layout 400 illustrates an N-well device that, similar to the P-well device in the chip layout 300, is a test device. The P-well device is first formed by first forming the active fins 206, 208, 210, 212, and 214. A gate dielectric and a gate electrode 402 are formed, as in the P-well device in FIG. 3. It is further contemplated that an optional second gate electrode 403 may be formed to form a double gate device.

The N-type LDD is implanted through a mask window 404 to make good electrical contact to the N-well. The P-type LDD is implanted through a mask window 406 to form the normal drain diode. Now, since electrical contact to the MOS body is available for electrical testing techniques such as C-V testing, the structures and parameters typical of MOS devices in neighboring integrated circuits can be evaluated.

Figure 5:
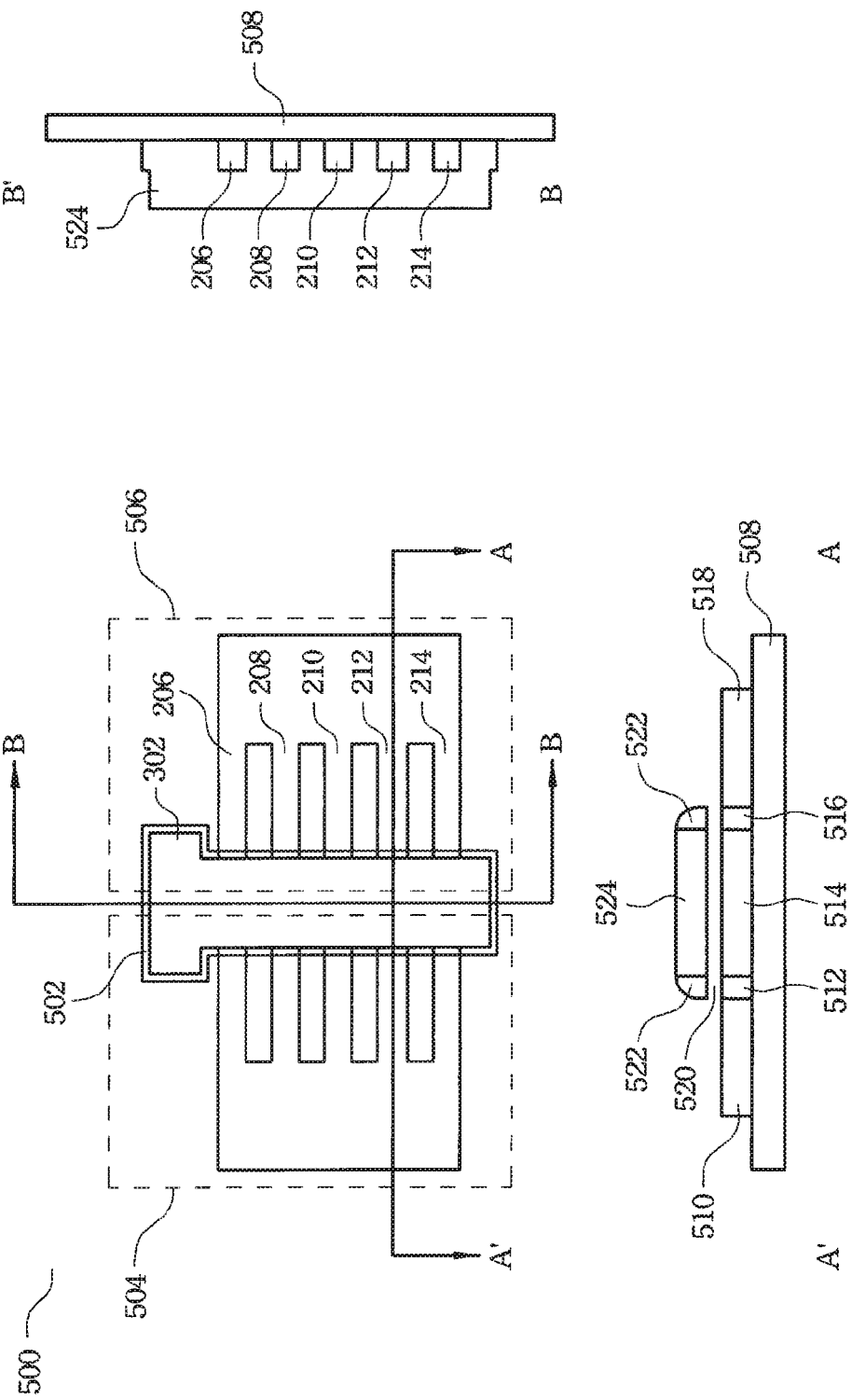
FIG. 5 presents a chip layout showing further processing done on the P-well device of FIG. 3 according to various aspects of the present disclosure.

In FIG. 5, a chip layout 500 illustrates further processing of the P-well device of FIG. 3. A spacer 502 is constructed around the sidewalls of the gate electrode 302 by standard techniques. For the spacer, dielectric material is deposited and vertically etched. The dielectric spacer may be composed of SiO2 or Si3N4 or a combination thereof.

The contact is heavily doped with P-type through a mask window 504 for good electrical contact and low electrical resistance. The spacer masks the dopant to complete the LDD structure. The N-contact is heavily doped with N-type through a mask window 506 for good electrical contact and low electrical resistance. The spacer masks the dopant to complete the LDD structure. The dopants are delivered by implantation, gas or solid source diffusion, or other common techniques.

Vertical cross section A-A' lies along the length of a vertical active fin, which lies on a BOX 508. The active fin includes a P+ contact area 510, a vertical P-LDD fin 512, a body fin 514 (also known as a vertical P-well), a vertical N-LDD 516, and an N+ contact area 518. The LDD areas and the well area are covered by a gate dielectric 520. Spacers 522 cover the P-LDD 512 and N-LDD 516. A gate electrode 524 covers the body fin 514.

Note that the PN junction created between the body fin 514 and the N+ contact area 518 increases the breakdown voltage tolerance of the device due to the lower drain side field, thus also allowing the device to be used as an ESD protection diode.

Vertical cross section B-B' lies along the length of the gate electrode 302, and across the fins 206, 208, 210, 212, and 214. A gate electrode 524 crosses all the fins and perfectly fills the slots between them.

Figure 6:
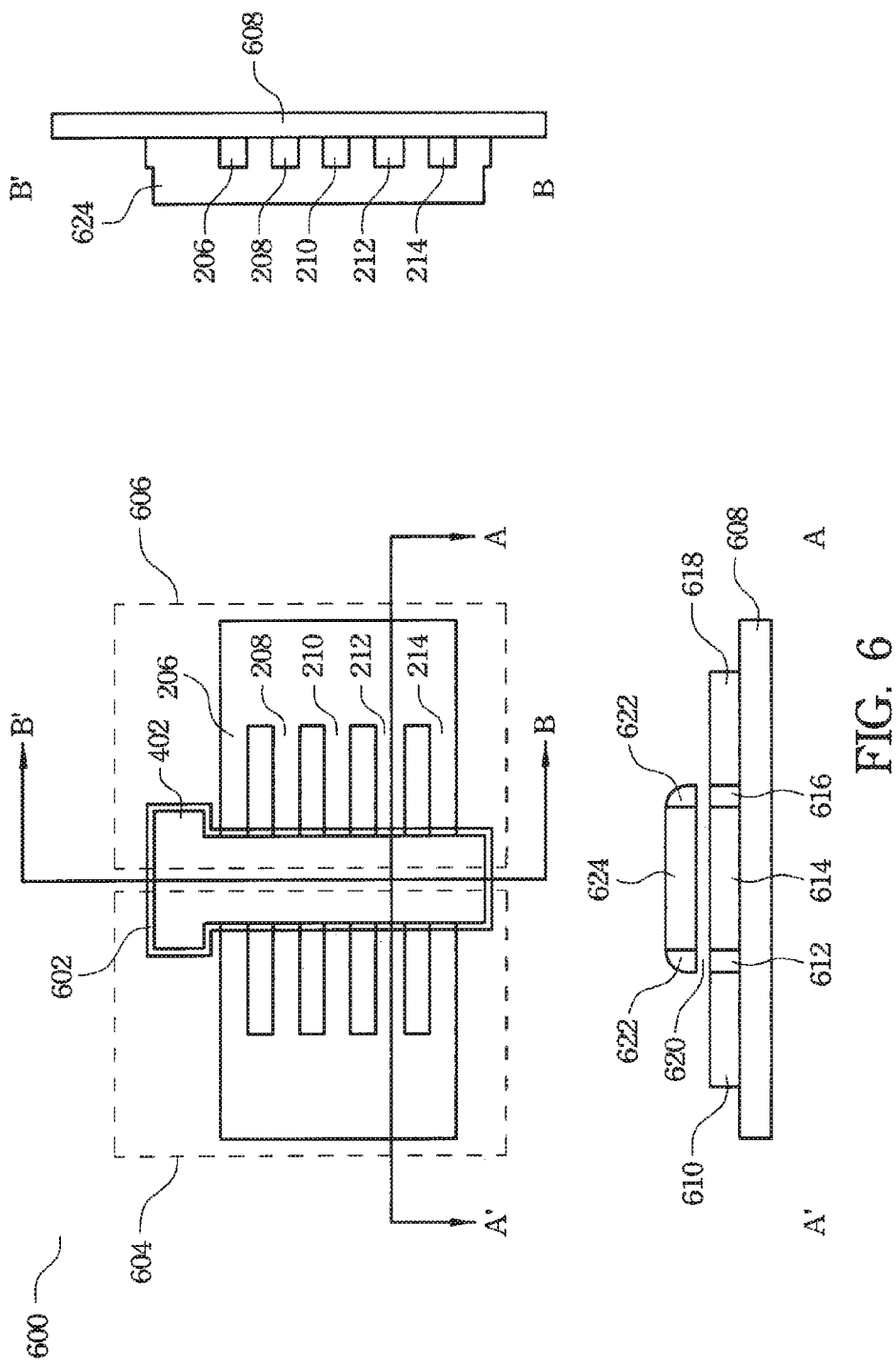
FIG. 6 presents a chip layout showing further processing done on the N-well device of FIG. 4.

In FIG. 6, a chip layout 600 illustrates further processing of the N-well device of FIG. 4. A spacer 602 is constructed around the sidewalls of the gate electrode 402 by standard techniques. For the spacer, dielectric material is deposited and vertically etched. The dielectric spacer may be composed of SiO2 or Si3N4 or a combination thereof.

The contact is heavily doped with N-type through a mask window 604 for good electrical contact and low electrical resistance. The spacer masks the dopant to complete the LDD structure. The P-contact is heavily doped with P-type through a mask window 606 for good electrical contact and low electrical resistance. The spacer masks the dopant to complete the LDD structure. The dopants are delivered by implantation, gas or solid source diffusion, or other common techniques.

Vertical cross section A-A' lies along the length of a vertical active fin, which lies on a BOX 608. The active fin includes an N+ contact area 610, a vertical N-LDD fin 612, a body fin 614, a vertical P-LDD 616, and a P+ contact area 618. The LDD areas and well area are covered by a gate dielectric 620. Spacers 622 cover the N-LDD 612 and the P-LDD 616. The gate electrode 624 covers the body fin 614. The body fin 614, which is of N-type, and the P+ contact area 618, which is of P-type, together provide a PN junction that increases the breakdown voltage tolerance of the device due to the lower drain side field, thus also allowing the device to be used as an ESD protection diode. In the preferred embodiment, break down voltage tolerance is about 3V for devices using the FinFET technology described herein, as opposed to about 2.25V for devices using planar silicon-on-insulator fabrication methods.

Vertical cross section B-B' lies along the length of the gate electrode 402, and across the fins 206, 208, 210, 212, and 214. The gate electrode 624 crosses all the fins and perfectly fills the slots between them.

A second embodiment is the construction of a device that is a real FinFET and yet provides contact to the body. This new opportunity to gain access to all four terminals of a FinFET allows realistic characterization of parameters of devices that are typical of those in the larger integrated circuits. Some examples of device parameters that can be easily extracted are: junction capacitance, overlay capacitance, gate current, and substrate current. With the extracted parameters such as these examples, an accurate device model can be realized.

Figure 7:
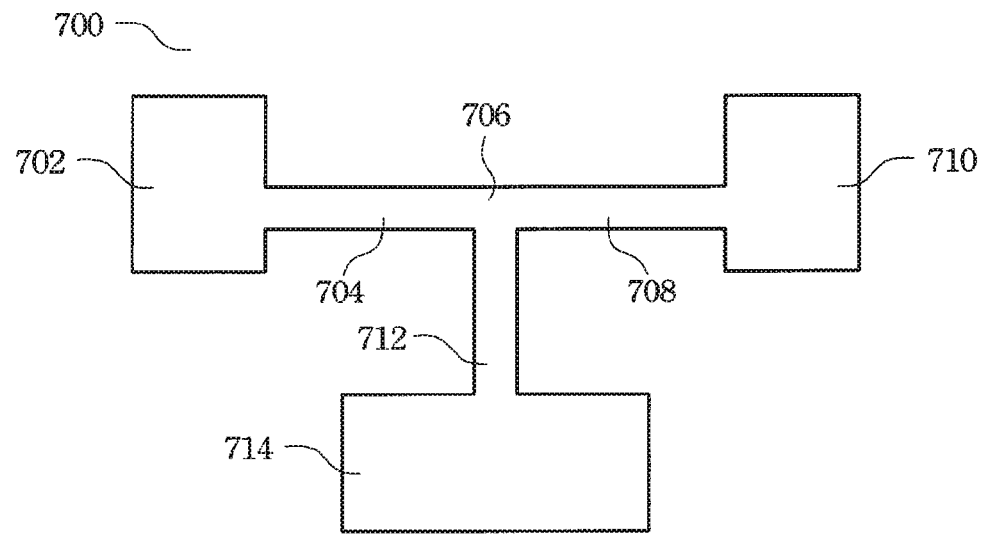
FIG. 7 presents a chip layout according to various aspects of the present disclosure.

In FIG. 7, a chip layout 700 illustrates a FinFET with a body contact. This is an N-channel MOSFET within a P-well. As understood by those skilled in the art, the following description also applies to P-channel MOSFET within an N-well. The active fin includes an N-source contact area 702, a vertical N-source fin 704, a vertical depletion fin or P-body fin 706, a vertical N-drain fin 708, and an N-drain contact area 710. The vertical P-body fin 706, which is the depletion region of the transistor's junction, is not yet apparent at this stage, but according to the present disclosure, there is a side fin, perpendicular to the active fin, and continuous with the active fin. This side fin is a P-body fin 712 that connects to a P-body contact area 714. The combination of the body contact area 714 and the P-body fin 712 is continuous with the active fin on one side.

Figure 8:
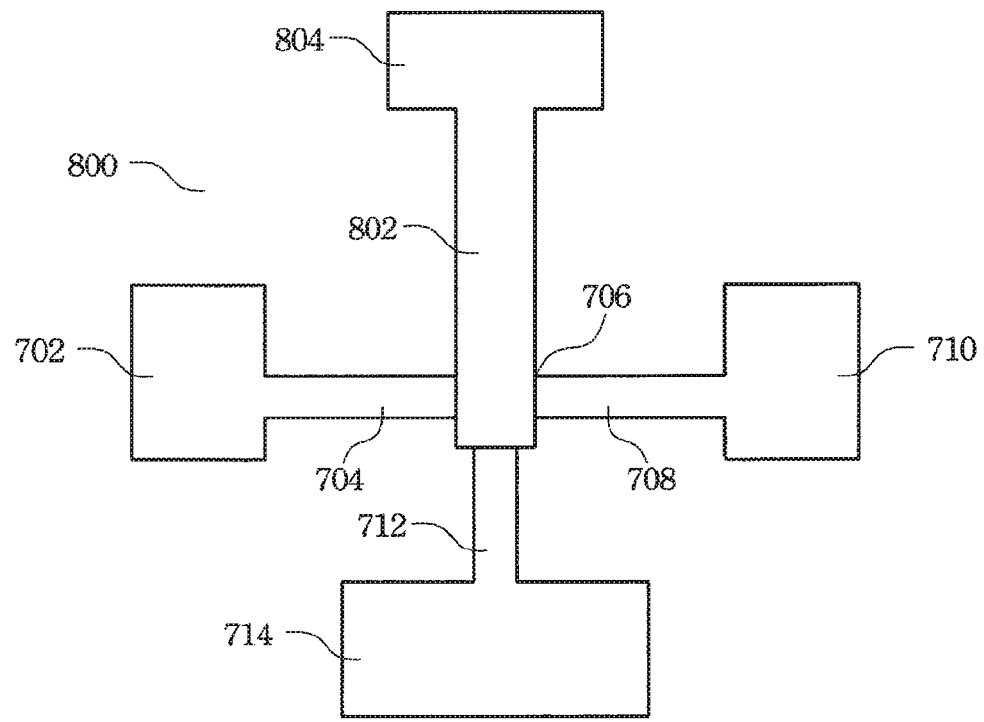
FIG. 8 presents a chip layout with a gate electrode according to various aspects of the present disclosure.

In FIG. 8, a chip layout 800 illustrates a four-terminal device with a body contact and a gate electrode comprising a vertical gate electrode fin 802 that is further connected to a gate contact area 804. The vertical gate electrode fin 802 extends across the vertical active fin to also overlap a short portion of the vertical P-body fin 712. This ensures that, even in the case of slight misalignment of subsequent N+ and P+ implant masks, not shown, the vertical gate electrode fin 802 will still completely cover the P-well or body region. If the vertical gate electrode fin 802 was too short, then N+ implant and/or N-LDD implant would short the source and drain. If the vertical P-body fin 712 were too wide, then misalignment could cause the vertical P-body fin 712 to be shorted to either the source or the drain.

Figure 9:
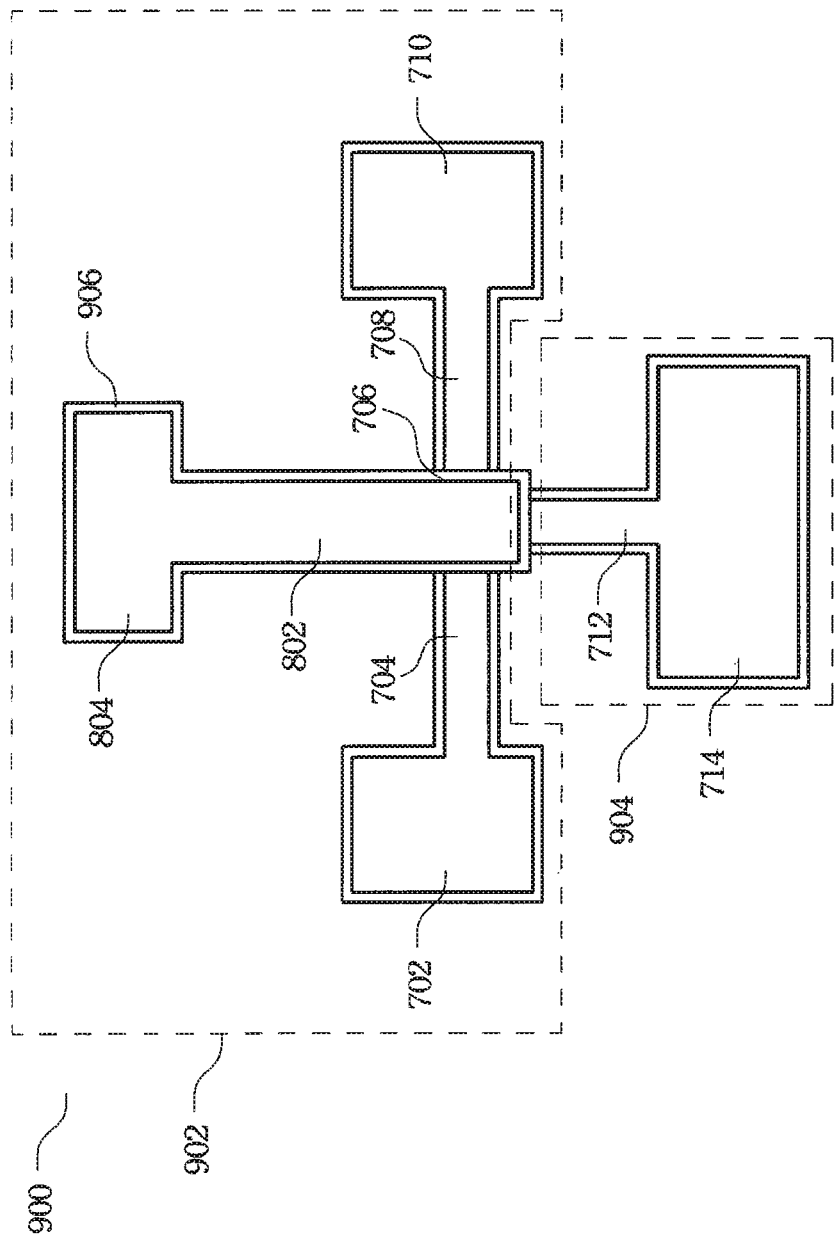
FIG. 9 presents a chip layout with two implant masks according to various aspects of the present disclosure.

In FIG. 9, a chip layout 900 illustrates the four-terminal device in FIG. 8 with two implant masks. An N-type LDD is implanted through a mask window 902 into the area 702 and the fin 704, the fin 708 and the area 710, and the fin 802 and the area 804. A P-type LDD is implanted through a mask window 904 into the P-body fin 712 and the body contact area 714. Then, spacers 906 are produced by standard techniques. Then, N+ is implanted through the mask window 902 into the area 702 and the fin 704, the fin 708 and the area 710, and the fin 802 and the area 804. P+ is implanted through the mask window 904 into the P-body fin 712 and the body contact area 714. The implants are annealed.

Figure 10:
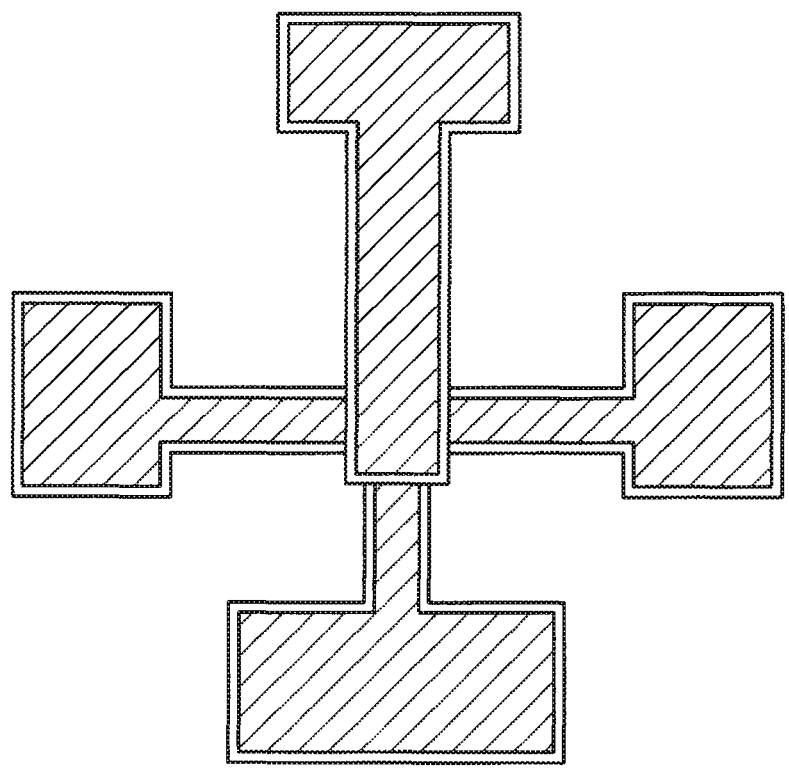
FIG. 10 presents a chip layout after a self-aligned silicide formation according to various aspects of the present disclosure.

In FIG. 10, a chip layout 1000 illustrates the four-terminal devices in FIG. 9 after a self-aligned silicide formation (salicide) in accordance with one embodiment of the present disclosure. Appropriate metal is alloyed into the silicon surfaces of the areas and fins pertaining to the source, the drain, the gate, and the body. These surfaces are separated by the spacers.

Figure 11:
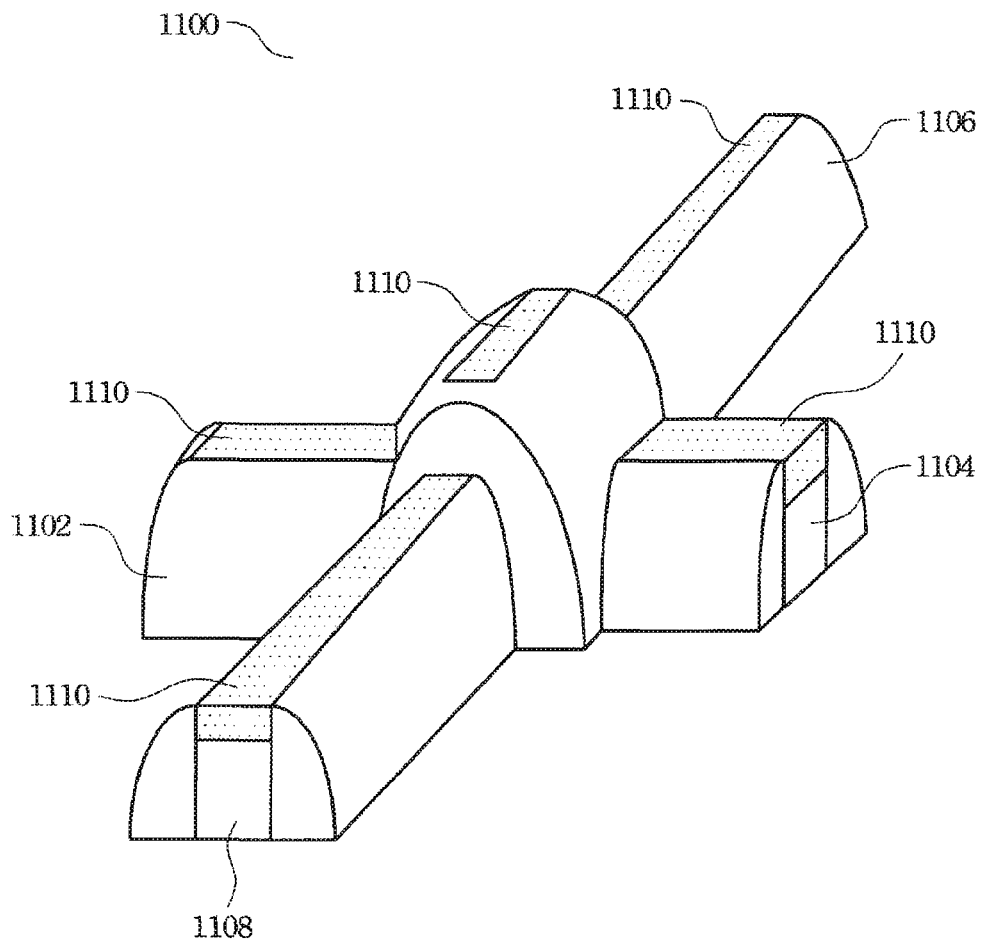
FIG. 11 presents an isometric view of the four-terminal device in FIG. according to various aspects of the present disclosure.

In FIG. 11, an isometric view 1100 illustrates the four-terminal device in FIG. 9 with the spacers formed and the exposed silicon surfaces silicided. The relationships are shown among a source 1102, a drain 1104, a gate 1106, and a body 1108. The exposed top surface of the silicon in each of the four areas is silicide 1110. As shown, the four silicide 1110 areas are separated.

The body contact technique in this FinFET can be used in I/O circuits. It can also be used in germanium on insulator or gallium arsenide on insulator (GOI) devices for the purpose of C-V measurements. The number of fins can be increased or a number of FinFETs can be connected to increase the effective dimension to increase the measurement accuracy.

The above illustration provides many different embodiments or embodiments for implementing different features of the invention. Specific embodiments of components and processes are described to help clarify the invention. These are, of course, merely embodiments and are not intended to limit the invention from that described in the claims.

For example, in view of the foregoing, the following provides a system for better enabling device characterization in FinFET environments. FinFET devices, along with methods for fabricating such devices, are disclosed herein for facilitating device characterization. An exemplary FinFET device includes a fin having a first portion extending in a first direction and a second portion extending from the first portion in a second direction. The second direction is substantially perpendicular to the first direction. The first portion includes a first region doped with a first type dopant disposed between second regions doped with a second type dopant. The first type dopant is opposite the second type dopant. A source contact and a drain contact are coupled to the second regions of the first portion, and a body contact is coupled to the second portion. A gate is disposed over the first region of the first portion, and the second portion extends from the first region. In some implementations, the FinFET device further includes spacers along sidewalls of the second regions of the first portion, the second portion, and the gate. In some implementations, the FinFET device further includes silicide regions disposed over the second regions of the first portion, the second portion, and the gate.

In some implementations, the first region defines a depletion region, and the second regions define a source region and a drain region. In some implementations, the gate extends in a third direction from over the first region, wherein the third direction is substantially perpendicular to the first direction. In some implementations, the gate extends across the first region, such that the gate is partially disposed over the second portion. In some implementations, the gate completely covers the first region of the first portion. In some implementations, the second portion is doped with the first type dopant. In some implementations, the source contact and the drain contact are doped with the second type dopant, and the body contact is doped with the first type dopant.

Another exemplary FinFET device for device characterization includes an active fin that includes a source fin, a depletion fin, and a drain fin, wherein the depletion fin is disposed between the source fin and the drain fin; a side fin extending from the depletion fin, wherein the side fin is coupled to a body contact configured to provide access to the FinFET device for the device characterization, and further wherein the side fin extends substantially perpendicular from the active fin; and a gate electrode and a gate dielectric disposed over the depletion fin, wherein the gate dielectric separates the gate electrode from the depletion fin. In some implementations, the FinFET device further includes a source contact coupled to the source fin, a drain contact coupled to the drain fin, and a gate contact coupled to the gate electrode.

In some implementations, the depletion fin includes a first type dopant, and the source fin and the drain fin include a second type dopant, where the first type dopant opposite the second type dopant. In some implementations, the side fin includes the first type dopant. In some implementations, the gate electrode and the gate dielectric extend across the active fin and overlap a portion of the side fin. In some implementations, the gate electrode and the gate dielectric cover the depletion region in a configuration that compensates for misalignment between implant masks used during doping operations performed during fabrication of the FinFET device, thereby preventing any short between the source fin and the drain fin.

An exemplary method for forming a FinFET device for device characterization includes forming an active fin that includes a source fin, a depletion fin, and a drain fin, wherein the depletion fin is disposed between the source fin and the drain fin; forming a side fin extending from the depletion fin, wherein the side fin extends substantially perpendicular from the active fin; forming a body contact coupled to the side fin, wherein the body contact is configured to provide access to the FinFET device for the device characterization; and forming a gate electrode and a gate dielectric over the depletion fin, wherein the gate dielectric separates the gate electrode from the depletion fin. In some implementations, the method further includes forming a source contact coupled to the source fin, forming a drain contact coupled to the drain fin, and forming a gate contact coupled to the gate electrode.

In some implementations, the method further includes performing a first implantation process using a first implant mask to form lightly doped source and drain (LDD) regions in the source fin and the drain fin, and performing a second implantation process using a second implant mask to form LDD regions in the side fin. In some implementations, forming the gate electrode and the gate dielectric includes extending the gate electrode and the gate dielectric across the active fin, such that the gate electrode and the gate dielectric cover the depletion region and overlap a portion of the side fin in a configuration that compensates for misalignment between the first implant mask and the second implant mask. In some implementations, the second implantation process is further performed on the body contact.

The construction and method of operation of the invention, however, together with additional objects and advantages thereof will be best understood from the following description of specific embodiments when read in connection with the accompanying drawings.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A FinFET device for facilitating device characterization, the FinFET device comprising:
   a fin having a first portion extending in a first direction and a second portion extending from the first portion in a second direction, the second direction being substantially perpendicular to the first direction, wherein the first portion includes a first region doped with a first type dopant disposed between second regions doped with a second type dopant, the first type dopant opposite the second type dopant;
   a source contact and a drain contact coupled to the second regions of the first portion;
   a body contact coupled to the second portion; and
   a gate disposed over the first region of the first portion, wherein the gate extends in the second direction beyond the first portion, such that the gate is disposed partially over the second portion, and further wherein the second portion extends from the first region, and further wherein a dimension of the gate in the first direction is greater than a dimension of the second portion in the first direction, such that the gate completely covers the first region of the first portion.

2. The FinFET device of claim 1, wherein the first region defines a depletion region, and the second regions define a source region and a drain region.

3. The FinFET device of claim 1, wherein the gate further extends in a third direction from over the first region, wherein the third direction is substantially perpendicular to the first direction and opposite the second direction.

4. The FinFET device of claim 1, further comprising a gate contact coupled to the gate.

5. The FinFET device of claim 1, wherein the dimension of the gate in the first direction is such that the gate extends partially over the second regions of the first portion.

6. The FinFET device of claim 1, wherein the second portion is doped with the first type dopant.

7. The FinFET device of claim 1, wherein the source contact and the drain contact are doped with the second type dopant, and the body contact is doped with the first type dopant.

8. The FinFET device of claim 1, further comprising spacers along sidewalls of the second regions of the first portion, the second portion, and the gate.

9. The FinFET device of claim 1, further comprising silicide regions disposed over the second regions of the first portion, the second portion, and the gate.

10. A FinFET device for device characterization, the FinFET device comprising:
    an active fin that includes a source fin, a depletion fin, and a drain fin, wherein the depletion fin is disposed between the source fin and the drain fin;
    a side fin extending from the depletion fin, wherein the side fin is coupled to a body contact configured to provide access to the FinFET device for the device characterization, and further wherein the side fin extends substantially perpendicular from the active fin; and
    a gate electrode and a gate dielectric disposed over the depletion fin, wherein the gate dielectric separates the gate electrode from the depletion fin and the gate electrode and the gate dielectric extend past the active fin to overlap a portion of the side fin, and further wherein a width of the gate electrode and the gate dielectric is greater than a width of the side fin, such that the gate electrode and the gate dielectric are disposed over a portion of the source fin and a portion of the drain fin.

11. The FinFET device of claim 10, further comprising spacers disposed along sidewalls of the active fin, the side fin, the gate electrode, and the gate dielectric.

12. The FinFET device of claim 10, wherein the gate electrode and the gate dielectric cover the depletion fin in a configuration that compensates for misalignment between implant masks used during doping operations performed during fabrication of the FinFET device, thereby preventing any short between the source fin and the drain fin.

13. The FinFET device of claim 10, further comprising:
a source contact coupled to the source fin;
a drain contact coupled to the drain fin; and
a gate contact coupled to the gate electrode.

14. The FinFET device of claim 10, wherein:
the depletion fin includes a first type dopant;
the source fin and the drain fin include a second type dopant, the first type dopant opposite the second type dopant; and
the side fin includes the first type dopant.

15. The FinFET device of claim 14, wherein the source fin and the drain fin each include a first lightly doped source and drain (LDD) region of the second type dopant and the side fin includes a second LDD region of the first type dopant.

16. A method for forming a FinFET device for device characterization, the method comprising:
forming an active fin that includes a source fin, a depletion fin, and a drain fin, wherein the depletion fin is disposed between the source fin and the drain fin;
forming a side fin extending from the depletion fin, wherein the side fin extends substantially perpendicular from the active fin;
forming a body contact coupled to the side fin, wherein the body contact is configured to provide access to the FinFET device for the device characterization;
forming a gate electrode and a gate dielectric over the depletion fin, wherein the gate dielectric separates the gate electrode from the depletion fin;
performing a first implantation process using a first implant mask to form lightly doped source and drain (LDD) regions in the source fin and the drain fin; and
performing a second implantation process using a second implant mask to form LDD regions in the side fin.

17. The method of claim 16, wherein the first implantation process uses a first type dopant, and the second implantation process uses a second type dopant that is different than the first type dopant.

18. The method of claim 16, wherein forming the gate electrode and the gate dielectric includes extending the gate electrode and the gate dielectric across the active fin, such that the gate electrode and the gate dielectric cover the depletion fin and overlap a portion of the side fin in a configuration that compensates for misalignment between the first implant mask and the second implant mask.

19. The method of claim 16, wherein the second implantation process is further performed on the body contact.

20. The method of claim 16, further comprising:
forming a source contact coupled to the source fin;
forming a drain contact coupled to the drain fin; and
forming a gate contact coupled to the gate electrode.

* * * * *